US 9,882,465 B2

(12) United States Patent
Pronovost et al.

(10) Patent No.: US 9,882,465 B2
(45) Date of Patent: Jan. 30, 2018

(54) COMMUTATION CELL, POWER CONVERTER AND COMPENSATION CIRCUIT HAVING DYNAMICALLY CONTROLLED VOLTAGE GAINS

(71) Applicant: TM4 INC., Boucherville (CA)

(72) Inventors: Christian Pronovost, Longueuil (CA); Jean-Marc Cyr, Candiac (CA)

(73) Assignee: TM4 INC., Boucherville, Quebec (CA)

( * ) Notice: Subject to any disclaimer, the term of this patent is extended or adjusted under 35 U.S.C. 154(b) by 0 days.

(21) Appl. No.: 15/035,454

(22) PCT Filed: Nov. 12, 2014

(86) PCT No.: PCT/CA2014/051085
§ 371 (c)(1),
(2) Date: May 9, 2016

(87) PCT Pub. No.: WO2015/070347
PCT Pub. Date: May 21, 2015

(65) Prior Publication Data
US 2016/0294275 A1 Oct. 6, 2016

Related U.S. Application Data
(60) Provisional application No. 61/904,050, filed on Nov. 14, 2013.

(51) Int. Cl.
*H02M 1/32* (2007.01)
*H02M 7/537* (2006.01)
(Continued)

(52) U.S. Cl.
CPC ............... *H02M 1/32* (2013.01); *H02M 1/08* (2013.01); *H02M 7/537* (2013.01);
(Continued)

(58) Field of Classification Search
CPC ...... H02M 1/00; H02M 3/155–3/1588; H02M 1/32; H02M 2001/0054;
(Continued)

(56) References Cited

U.S. PATENT DOCUMENTS 6,184,740 B1 * 2/2001 Miettinen ............ H03K 17/168
327/109
6,633,473 B1 * 10/2003 Tomomatsu ....... H03K 17/0828
257/E29.198
(Continued)

FOREIGN PATENT DOCUMENTS

WO 2013/082705 6/2013
WO WO 2013082705 A1 * 6/2013 .............. H02M 1/08
(Continued)

OTHER PUBLICATIONS

Lobsiger et al, "Closed-loop IGBT gate drive featuring highly dynamic di/dt and dv/dt control", Energy Conversion Congress and Exposition (ECCE), Sep. 2012, pp. 4754-4761.
(Continued)

*Primary Examiner* — Yusef Ahmed
(74) *Attorney, Agent, or Firm* — Fay Kaplun & Marcin, LLP

(57) ABSTRACT

A commutation cell is configured for limiting switching overvoltage. The commutation cell includes a power electronic switch having a parasitic emitter inductance through which a voltage is generated upon turning off of the power electronic switch. The commutation cell also includes a dynamically controlled compensation circuit connected to the parasitic emitter inductance. The compensation circuit applies a controllable portion of the voltage generated through the parasitic emitter inductance at turn-off of the power electronic switch to control the voltage generated through the parasitic emitter inductance. A power converter
(Continued)

includes a pair of commutation cells and a compensation circuit of the commutation cell.

17 Claims, 6 Drawing Sheets

(51) Int. Cl.
| | | |
|---|---|---|
| *H02M 1/08* | (2006.01) | |
| *H03K 17/16* | (2006.01) | |
| *H03K 17/081* | (2006.01) | |
| *H02M 3/156* | (2006.01) | |
| *H02M 7/217* | (2006.01) | |
| *H02M 1/34* | (2007.01) | |
| *H03K 17/04* | (2006.01) | |

(52) U.S. Cl.
CPC ......... *H03K 17/081* (2013.01); *H03K 17/166* (2013.01); *H02M 3/156* (2013.01); *H02M 7/217* (2013.01); *H02M 2001/344* (2013.01); *H03K 17/04* (2013.01)

(58) Field of Classification Search
CPC ... H02M 2001/0029; H02M 2001/344; H02M 7/537; H02M 7/538; H02M 1/08; H02M 1/081; H02M 1/082; H03K 17/08; H03K 17/081; H03K 17/0812; H03K 17/0814; H03K 17/08128; H03K 17/0828; H03K 17/166; H03K 2217/0063; H03K 2217/0072
See application file for complete search history.

(56) References Cited

U.S. PATENT DOCUMENTS

| | | | | |
|---|---|---|---|---|
| 2003/0021131 A1* | 1/2003 | Nadot | ................. | H02M 1/34 363/55 |
| 2003/0095365 A1* | 5/2003 | Nakatake | ............... | H02H 7/122 361/91.1 |
| 2005/0057866 A1* | 3/2005 | Mergens | ............. | H01L 27/0262 361/56 |
| 2005/0146295 A1* | 7/2005 | Miyamoto | ............. | B60L 11/123 318/105 |
| 2005/0184793 A1* | 8/2005 | Torres | ................ | H03K 17/0828 327/478 |
| 2005/0206438 A1* | 9/2005 | Higashi | ................ | H03K 17/166 327/427 |
| 2007/0200602 A1* | 8/2007 | Ishikawa | ............ | H03K 17/0406 327/110 |
| 2008/0084642 A1* | 4/2008 | Kato | .................. | H03K 17/0828 361/56 |
| 2008/0303580 A1* | 12/2008 | Stegmayr | ............. | H03K 17/063 327/390 |
| 2010/0148830 A1* | 6/2010 | Nilson | ............... | H03K 17/0828 327/108 |
| 2010/0238734 A1* | 9/2010 | Yuda | .................... | G11C 11/5621 365/185.18 |
| 2011/0273206 A1* | 11/2011 | Lee | ......................... | H02M 1/08 327/109 |
| 2012/0013371 A1* | 1/2012 | Nakatake | ............. | H03K 17/168 327/109 |
| 2012/0235663 A1* | 9/2012 | Bayerer | ................ | H02M 1/088 323/311 |
| 2013/0181750 A1* | 7/2013 | Lobsiger | .......... | H03K 17/08148 327/109 |
| 2014/0240007 A1* | 8/2014 | Gibson | .................. | H03K 17/00 327/109 |
| 2014/0321178 A1* | 10/2014 | Cyr | ......................... | H02M 1/08 363/131 |
| 2014/0334214 A1* | 11/2014 | Katoh | ............... | H02M 7/53803 363/132 |
| 2014/0375362 A1* | 12/2014 | Lobsiger | ............... | H03K 17/00 327/109 |
| 2015/0028923 A1* | 1/2015 | Peng | .................... | H03K 17/166 327/109 |
| 2015/0180462 A1* | 6/2015 | Bouchez | ............ | H03K 17/0828 327/109 |
| 2015/0222202 A1* | 8/2015 | Cyr | .................... | H03K 17/0828 363/131 |
| 2016/0005725 A1* | 1/2016 | Ikeda | ...................... | H01L 25/18 257/76 |
| 2016/0308525 A1* | 10/2016 | Gonzalez Senosiain | ............... | H02M 1/08 |

FOREIGN PATENT DOCUMENTS

| | | |
|---|---|---|
| WO | 2014/043795 | 3/2014 |
| WO | 2014/161080 | 10/2014 |
| WO | 2015/061901 | 5/2015 |
| WO | 2015/070344 | 5/2015 |

OTHER PUBLICATIONS

Dulau et al., "A new gate driver integrated circuit for IGBT devices with advanced protections", IEEE Transactions on Power Electronics, vol. 21, Issue 1, Jan. 2006, pp. 38-44.

Jean-Marc Cyr et al.,"Reducing switching losses and increasing IGBT drive efficiency with ReflexTM gate driver technology" Apr. 23, 2013, 12 sheets.

* cited by examiner

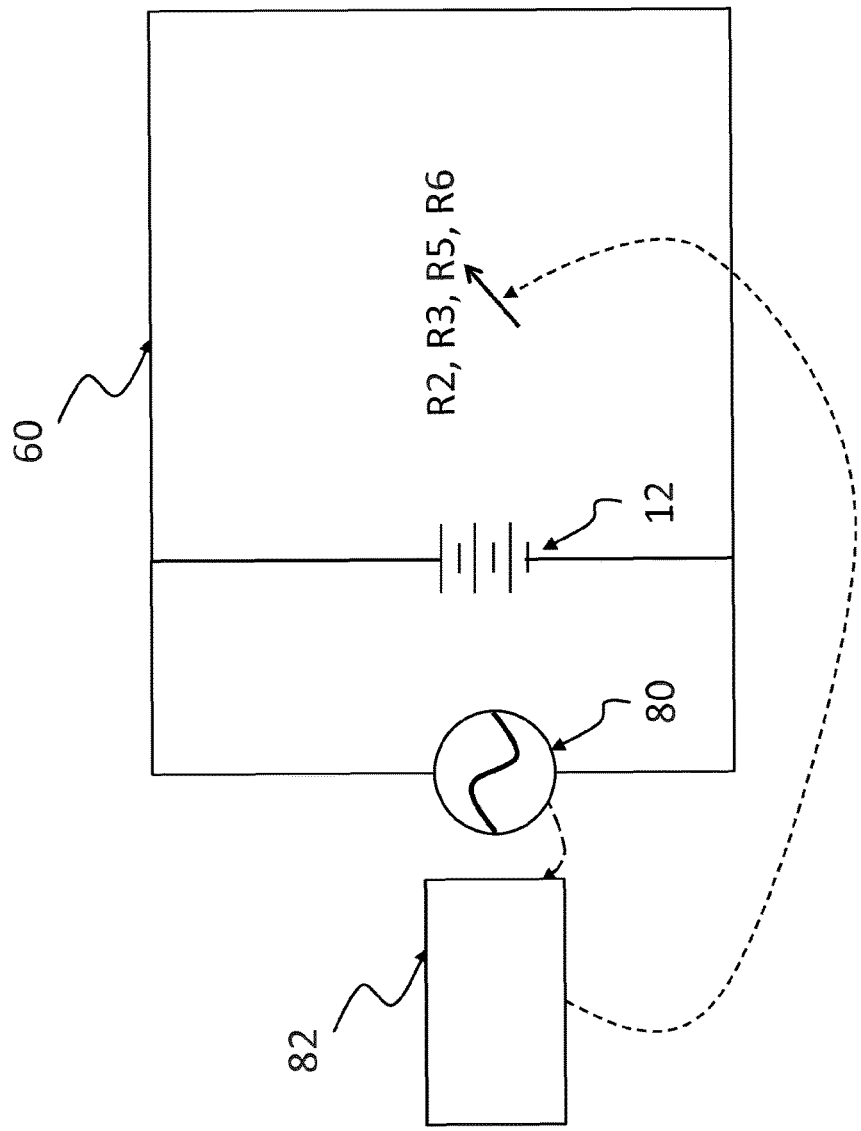

COMMUTATION CELL, POWER CONVERTER AND COMPENSATION CIRCUIT HAVING DYNAMICALLY CONTROLLED VOLTAGE GAINS

TECHNICAL FIELD

The present disclosure relates to the field of power electronics. More specifically, the present disclosure relates to a commutation cell configured for limiting switching overvoltage at turn-off of a power electronic switch. The present disclosure further relates to a dynamically controlled compensation circuit for use in a commutation cell and to a power converter including the commutation cell with the dynamically controlled compensation circuit.

BACKGROUND

Commutation cells are commonly used in power electronic systems that require conversion of a voltage source, including both DC-DC converters and DC-AC converters, the latter often being called inverters. With the limited space allowed for power converter circuits, such as those used for example in electric and/or electric hybrid automotive applications, and given the high cost of the semi-conductors, the demand for integration of these commutation cells increases.

A known way of reducing the space occupied by semiconductors in power converter circuits is to increase their efficiency to thereby allow the size of their cooling surface to be reduced.

Losses in power electronic switches present in conventional power converter circuits are mainly caused by two sources; conduction losses and switching losses. One way to reduce switching losses is generally by accelerating the turn-on and turn-off of the power electronic switches. However, fast turn-off of the power electronic switches generates overvoltage in parasitic (stray) inductances of their high-frequency loop. It is thus often required to slow down turning off of the power electronic switches to protect them against overvoltage. This may seriously impact the overall efficiency of conventional power converter circuits.

FIG. 1 is an idealized circuit diagram of a conventional commutation cell such as those used in conventional power converter circuits. A commutation cell 10 converts a DC voltage $V_{bus}$ from a voltage source 12 (or from a capacitor) into a current source $I_{out}$ (or into an inductance) that usually generates a voltage $V_{out}$ appropriate for a load 14, which may be a resistive load, an electric motor, and the like. The commutation cell 10 comprises a freewheel diode 16 and a controlled power electronic switch 18, for example an isolated gate bipolar transistor (IGBT). A capacitor 20 ($C_{in}$) is used to limit variations of the voltage $V_{bus}$ of the voltage source 12 and an inductance 32 is used to limit the variations of the output current $I_{out}$. A gate driver (not shown in FIG. 1 but shown on later Figures) controls turning on and off of the power electronic switch 18. FIG. 1 illustrates a configuration of the commutation cell 10, of the load 14, and of the voltage source 12, in which energy flows from the voltage source 12 to the load 14, i.e. from left to right on the drawing. The commutation cell 10 can also be used in a reverse configuration in which energy flows in the opposite direction.

When turned on, the power electronic switch 18 allows current to pass therethrough, from its collector 22 to its emitter 24; at that time, the power electronic switch 18 can be approximated as a closed circuit. When turned off, the power electronic switch 18 does not allow current to pass therethrough and becomes an open circuit.

The gate driver applies a variable control voltage between the gate 26 and the emitter 24 of the power electronic switch 18. For some types of power electronic switches such as bipolar transistors, the gate driver may act as a current source instead of as a voltage source. Generally, when the voltage applied between the gate 26 and the emitter 24 is "high", the power electronic switch 18 allows passing of current from the collector 22 to the emitter 24. When the voltage applied between the gate 26 and the emitter 24 is "low", the power electronic switch 18 blocks passage of current therethrough. In more details, a voltage difference between the gate 26 and the emitter 24, denoted $V_{ge}$, is controlled by the gate driver. When $V_{ge}$ is greater than a threshold $V_{ge(th)}$ for the power electronic switch 18, the switch 18 is turned on and a voltage $V_{ce}$ between the collector 22 and the emitter 24 becomes near zero. When $V_{ge}$ is lower than $V_{ge(th)}$, the power electronic switch 18 is turned off and $V_{ce}$ eventually reaches $V_{bus}$.

When the power electronic switch 18 is turned on, a current $I_{out}$ flows from the voltage source 12 (and transiently from the capacitor 20) through the load 14 and through the collector 22 and the emitter 24. When the power electronic switch 18 is turned off, the current $I_{out}$ circulates from the load 14 and passes in the freewheel diode 16. It may thus be observed that the power electronic switch 18 and the freewheel diode 16 operate in tandem. Turning on and off of the power electronic switch 18 at a high frequency allows the current $I_{out}$, in the output inductance $L_{out}$ 32, to remain fairly constant.

It should be observed that, in the case of other power electronic switch types, for example bipolar transistors, the term "gate" may be replaced with "base", the base being controlled by a current as opposed to the gate that is controlled by a voltage. These distinctions do not change the overall operation principles of the commutation cell 10.

FIG. 2 is another circuit diagram of the conventional commutation cell of FIG. 1, showing parasitic (stray) inductances. In contrast with the idealized model of FIG. 1, connections between components of an actual commutation cell define parasitic inductances. Though the parasitic inductances are distributed at various places within the commutation cell 10, a suitable model presented in FIG. 2 shows two (2) distinct inductances representing the overall parasitic inductance, including an emitter inductance 30 of the power electronic switch 18 and an inductance 34 representative of all other parasitic inductances (other than the emitter inductance 30) around a high frequency loop 36 formed by the freewheel diode 16, the power electronic switch 18 and the capacitor 20. The high frequency loop 36 is a path where current changes significantly upon switching of the power electronic switch 18. It should be noted that an output inductance $L_{out}$ 32 is not part of the high frequency loop because its current remains fairly constant through the commutation period.

FIG. 3 is a circuit diagram of a conventional commutation cell further showing a gate driver 40. Some elements of the commutation cell 10 are not shown on FIG. 3, in order to simply the illustration. FIG. 3 further shows a gate driver 40 having a positive supply voltage 42 and a negative supply voltage 44, an output 46 of the gate driver 40 being connected to the gate 26 of the power electronic switch 18 via a gate resistor $R_g$. The positive supply voltage 42 of the gate driver 40 has a value denoted $+V_{cc}$, for example +15 volts above a ground reference (shown on a later Figure) while the negative supply voltage 44 has value denoted $-V_{dd}$, for example $-5$ volts below the ground reference. An input 48 of the gate driver 40 is connected to a controller (not shown) of the commutation cell 10, as is well known in the art. A voltage at the output 46 of the gate driver 40 goes up to $+V_{cc}$ and goes down to $-V_{dd}$ in order to control the voltage at the gate 26. The input resistance of the gate 26 to emitter may be very high, especially in the case of an IGBT. However, a parasitic Miller capacitance $C_{ge}$ (shown on a later Figure), present between the gate 26 and the emitter 24, causes some current to flow from the output 46 when the gate driver 40 alternates between $+V_{cc}$ and $-V_{dd}$. The value $R_g$ of the gate resistor is selected as a function of the parasitic capacitance $C_{ge}$ and of a desired switching rate of the power electronic switch 18 so that the voltage at the gate 26 changes at rate appropriate for the desired switching rate.

On FIG. 3, a current $I_{igbt}$ flowing through the power electronic switch 18 and through the emitter parasitic inductance 30 is essentially equal to $I_{out}$ when the power electronic switch 18 is closed, and quickly reduces to zero (substantially) when the power electronic switch 18 turns off.

When the power electronic switch 18 turns on or off, the current $I_{igbt}$ flowing therethrough increases or diminishes at a fast rate. These variations of $I_{igbt}$ denoted di/dt, generate voltage across inductances 30 and 34, according to the well-known equation (1):

$$V_L = L \cdot \frac{di}{dt} \quad (1)$$

wherein $V_L$ is a voltage induced across an inductance and L is an inductance value.

A voltage $V_{Ls}$ is generated across the parasitic inductance 34 and a voltage $V_{Le}$ is generated across the emitter parasitic inductance 30. On FIGS. 2 and 3, the polarities shown across the high frequency loop inductance 34, including the emitter inductance 30 reflect voltages obtained upon turn-off of the power electronic switch 18, when the $I_{igbt}$ current diminishes very rapidly, di/dt thus taking a negative value. Upon turn-on of the power electronic switch 18, voltages across the high frequency loop inductance 34, including the emitter inductance 30 are in the opposite direction.

These voltages $V_{Ls}$ and $V_{Le}$ are in series with $V_{bus}$ from the voltage source 12. When the power electronic switch 18 turns off, the collector 22 to emitter 24 voltage increases until the freewheel diode 16 turns on. At that time, addition of $V_{bus}$, $V_{Ls}$ and $V_{Le}$ results in an important overvoltage applied between the collector 22 and the emitter 24 of the power electronic switch 18. Though power electronic switches are rated for operation at some level of voltage, extreme overvoltage can reduce the lifetime of any power electronic switch to thereby lead to its premature failure or even break the device.

FIG. 4 is a circuit diagram of a conventional IGBT leg formed of two conventional commutation cells. Two commutation cells 10 introduced in the above description of FIGS. 1-3, in which IGBTs are used as power electronic switches 18 in the example of FIG. 4, are connected in a single loop to form an IGBT leg 70 of a power converter 50. A first power electronic switch (bottom IGBT $Q_1$) operates in tandem with a first freewheel diode (top freewheel diode $D_2$) and a second power electronic switch (top IGBT $Q_2$) operates in tandem with another freewheel diode (bottom freewheel diode $D_1$). Each IGBT has its own gate driver 40. A voltage source 12 provides a voltage $V_{bus}$ in parallel to an input capacitance 20 ($C_{in}$) connected to the IGBT leg 70 via a parasitic inductance $L_c$. Inductances inherently provided in wires, connections, decoupling capacitor and circuit board traces of a power converter have been represented in FIG. 4. A three-phase power converter used for powering a three-phase electric motor (not shown) from a battery (also not shown), would comprise three (3) IGBT legs 70 as shown on FIG. 4. Since such power converters are believed well-known, they are not described in further details herein.

As can be seen from FIG. 4, a reference of each gate driver is connected to the emitter of the IGBT $Q_1$ and $Q_2$, typically known as logical pins of the IGBTs $Q_1$ and $Q_2$. For concision purpose, a description of FIG. 4 focuses on its bottom portion including the bottom IGBT $Q_1$.

The overvoltage effect on a power electronic switch 18, discussed in the above description of FIGS. 2 and 3, also applies to the IGBTs $Q_1$ and $Q_2$.

When the bottom IGBT $Q_1$ is turned off, current transits from the bottom IGBT $Q_1$ to the top freewheel diode $D_2$, during an overvoltage period. A properly selected IGBT is able to support the overvoltage created by a current variation (di/dt) across various parasitic inductances ($L_c$, $L_{+Vbus}$, $L_{c\text{-}high}$, $L_{e\text{-}high}$, $L_{c\text{-}low}$, $L_{e\text{-}low}$ and $L_{-Vbus}$) present in the IGBT leg 70. Indeed, since the inductances resist change of current therein, additive voltages develop in the IGBT leg 70 as illustrated by the polarities of the parasitic inductances shown on in FIG. 4. These voltages, added to the voltage $V_{bus}$ of the source, often result in a voltage exceeding the maximal collector to emitter voltage $V_{ce}$ rating of the bottom IGBT $Q_1$. The top IGBT $Q_2$ is subject to the same problem.

Solutions exist that tend to limit overvoltage in power electronic switches by slowing down the slope of the gate-emitter voltage. However, excessive limitation of the overvoltage can imply longer switching times of the current, reducing commutation cell performance.

Also, the commutation cell 10 and the power converter 50 can deliver their maximum power when operating at high bus voltages $V_{bus}$. Current solutions to limit the overvoltage generated across the parasitic inductances of the high frequency loop 36 allow using bus voltages approaching the maximum voltage rating of the power electronic switches 18. However, bus voltages may vary over time or between different applications. For those reasons, overvoltage protection in conventional commutation cells generally need to be overdesigned, as a safety measure, As such, conventional commutation cells operate at less than their maximum attainable power output.

Therefore, there is a need for circuits capable of reducing overvoltage occurring upon switching in a commutation cell.

SUMMARY

According to the present disclosure, there is provided a commutation cell configured for limiting switching overvoltage. The commutation cell comprises a power electronic switch having a parasitic emitter inductance through which a voltage is generated upon turning on and off of the power electronic switch. The commutation cell also comprises a dynamically controlled compensation circuit connected to the parasitic emitter inductance. The compensation circuit applies a controllable portion of the voltage generated through the parasitic emitter inductance at turn-off of the power electronic switch to control the voltage generated through the parasitic emitter inductance.

According to the present disclosure, there is also provided a power converter, comprising two of the commutation cells configured for limiting switching overvoltage by use of respective dynamically controlled compensation circuits. The two commutation cells form a loop and are connected at a junction of a collector of a first power electronic switch of a first commutation cell and of an emitter of a second power electronic switch of a second commutation cell.

The present disclosure further relates to a compensation circuit for limiting switching overvoltage on a power electronic switch of a commutation cell, the commutation cell including a high frequency loop having a parasitic inductance through which a voltage is generated upon turning off of the power electronic switch, the high frequency loop parasitic inductance including a parasitic emitter inductance of the power electronic switch. The compensation circuit comprises a dynamically controlled voltage divider configured to provide a controllable gain of a voltage generated on the parasitic emitter inductance at turn-off of the power electronic switch. The compensation circuit also comprises a connection from the voltage divider to apply to a gate driver of the power electronic switch a portion of the voltage generated through the parasitic emitter inductance according to the controllable gain to reduce the voltage generated on the parasitic inductance of the high frequency loop.

The foregoing and other features will become more apparent upon reading of the following non-restrictive description of illustrative embodiments thereof, given by way of example only with reference to the accompanying drawings.

BRIEF DESCRIPTION OF THE DRAWINGS

Embodiments of the disclosure will be described by way of example only with reference to the accompanying drawings, in which:

FIG. 6 is a block diagram showing a controller connected to the IGBT leg of FIG. 5.

Like numerals represent like features on the various drawings.

DETAILED DESCRIPTION

Various aspects of the present disclosure generally address one or more of the problems of overvoltage present in commutation cells and power converters at the time of switching.

Circuits operable to limit overvoltage in commutation cells, especially at turn-off of IGBTs, are described in international patent publication no WO 2013/082705 A1, in international patent application no PCT/CA2013/000805, in U.S. provisional applications No. 61/808,254, No. 61/898,502, No. 61/904,038 and No. 61/904,050, and in "Reducing switching losses and increasing IGBT drive efficiency with Reflex™ gate driver technology", available at http://www.advbe.com/docs/DeciElec2013-Jean_Marc_Cyr-TM4.pdf, all of which are authored by Jean-Marc Cyr et al. the disclosure of these being incorporated by reference herein.

The present technology provides control of overvoltage and switching losses at turn-off of a power electronic switch of a commutation cell. Circuits and methods presented herein are generally compatible with other solutions to limit overvoltage at turn-off of power electronic switches.

In a commutation cell, di/dt at turn-off of a power electronic switch generates a voltage across parasitic (stray) inductances of a high frequency loop of the commutation cell. This voltage is applied across the power electronic switch in addition to a bus voltage providing power to the commutation cell. A solution based on the injection of a sample of the overvoltage present across the power electronic switch to a gate driver of the power electronic switch has been proposed. A commutation cell built according to the present disclosure comprises a dynamically controlled compensation circuit connected to a parasitic emitter inductance of a power electronic switch. The compensation circuit applies a controllable portion of the voltage generated through the parasitic emitter inductance at turn-off of the power electronic switch to control the voltage generated through the parasitic emitter inductance.

The techniques disclosed herein will mainly be described in relation to power converters including pairs of commutation cells. The same teachings are however applicable to single commutation cells. Additionally, the following description will mainly relate to the use of isolated gate bipolar transistors (IGBT). Mentions of IGBTs in the following description are made for illustration purposes and are not meant to limit the present disclosure. The same techniques may equally be applied to commutation cells constructed using metal-oxide-semiconductor field-effect transistors (MOSFET), bipolar transistors and like power electronic switches.

Figure 1:
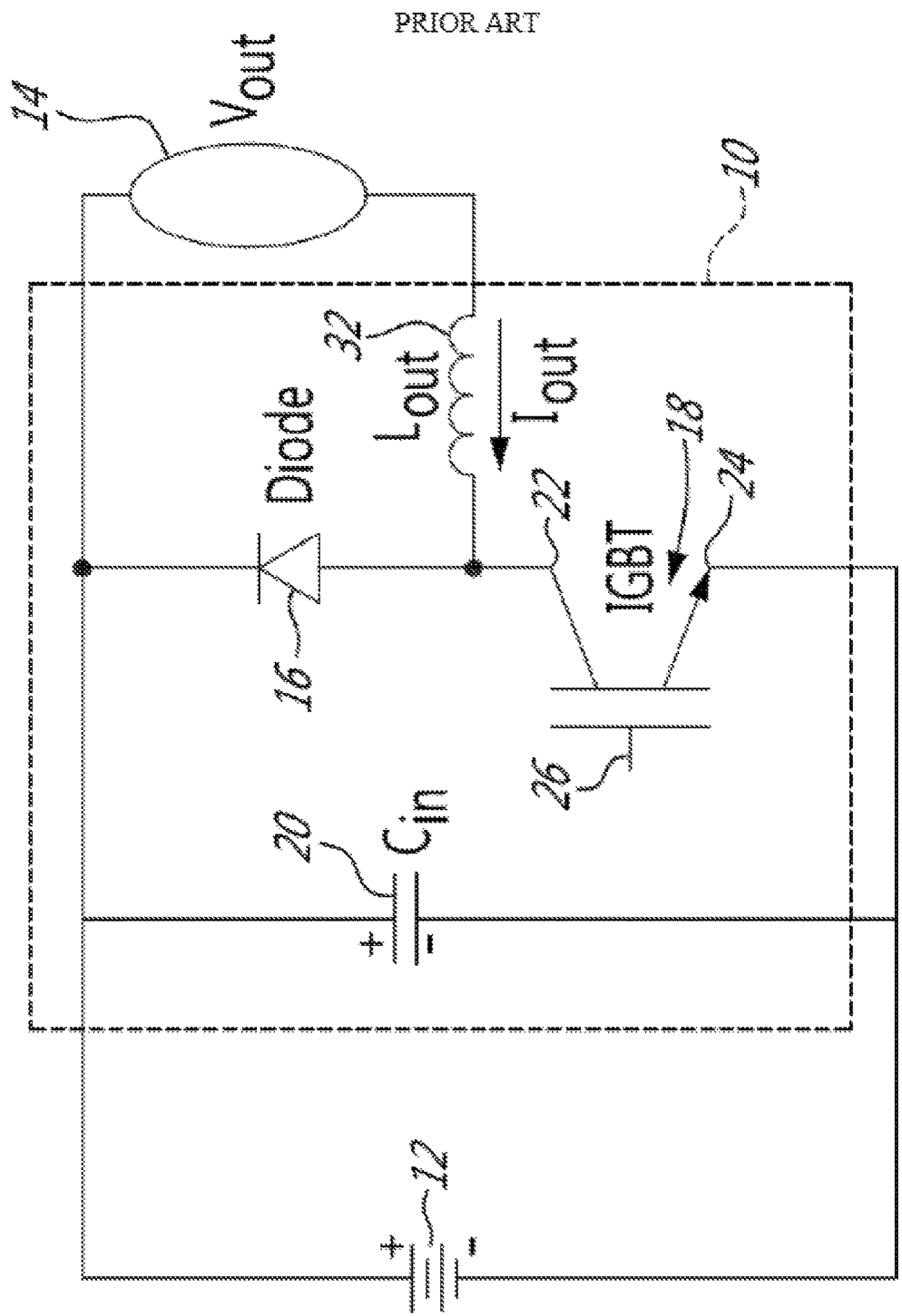
FIG. 1 is an idealized circuit diagram of a conventional commutation cell such as those used in conventional power converter circuits.
Figure 2:
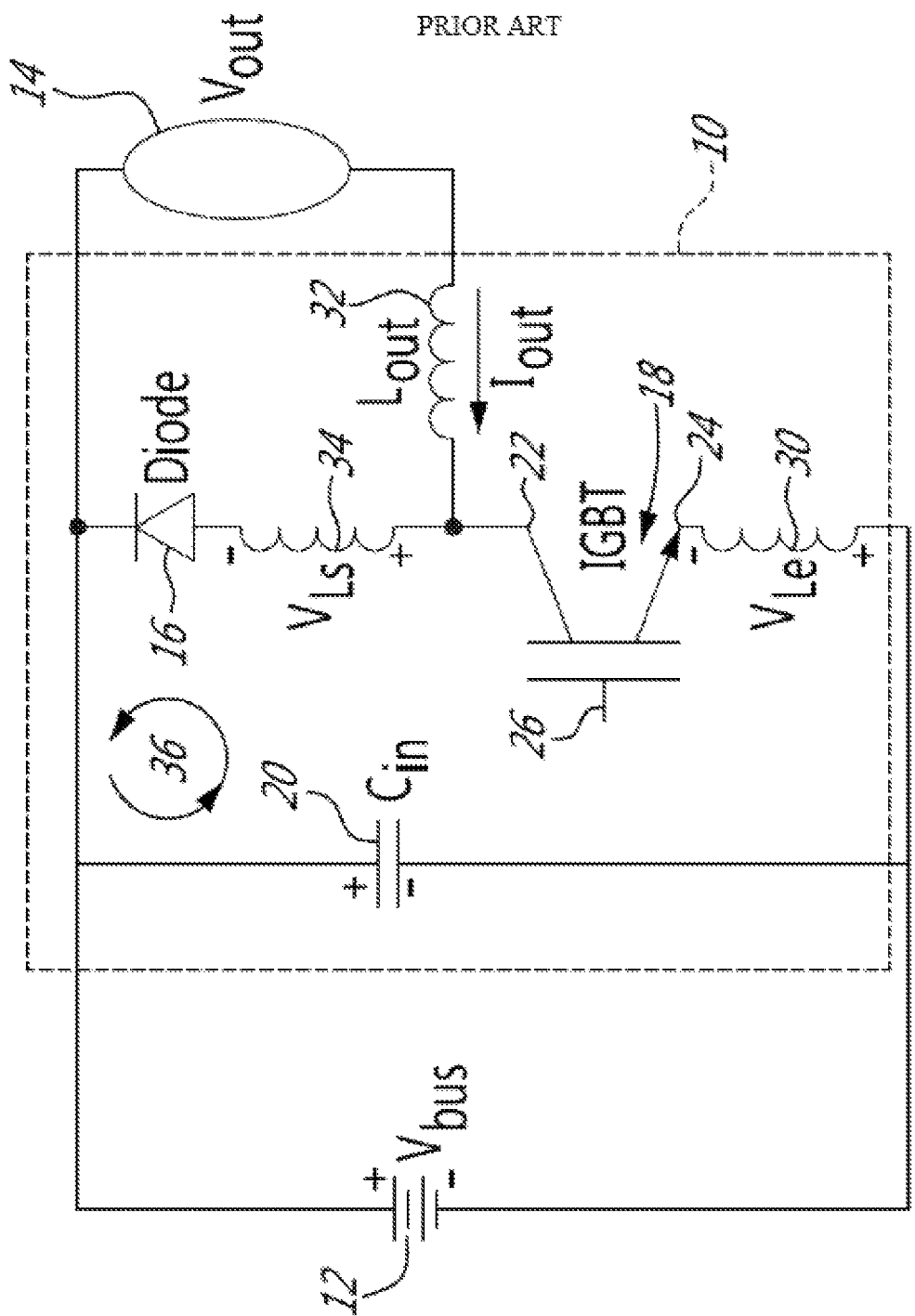
FIG. 2 is another circuit diagram of the conventional commutation cell of FIG. 1, showing parasitic (stray) inductances.
Figure 3:
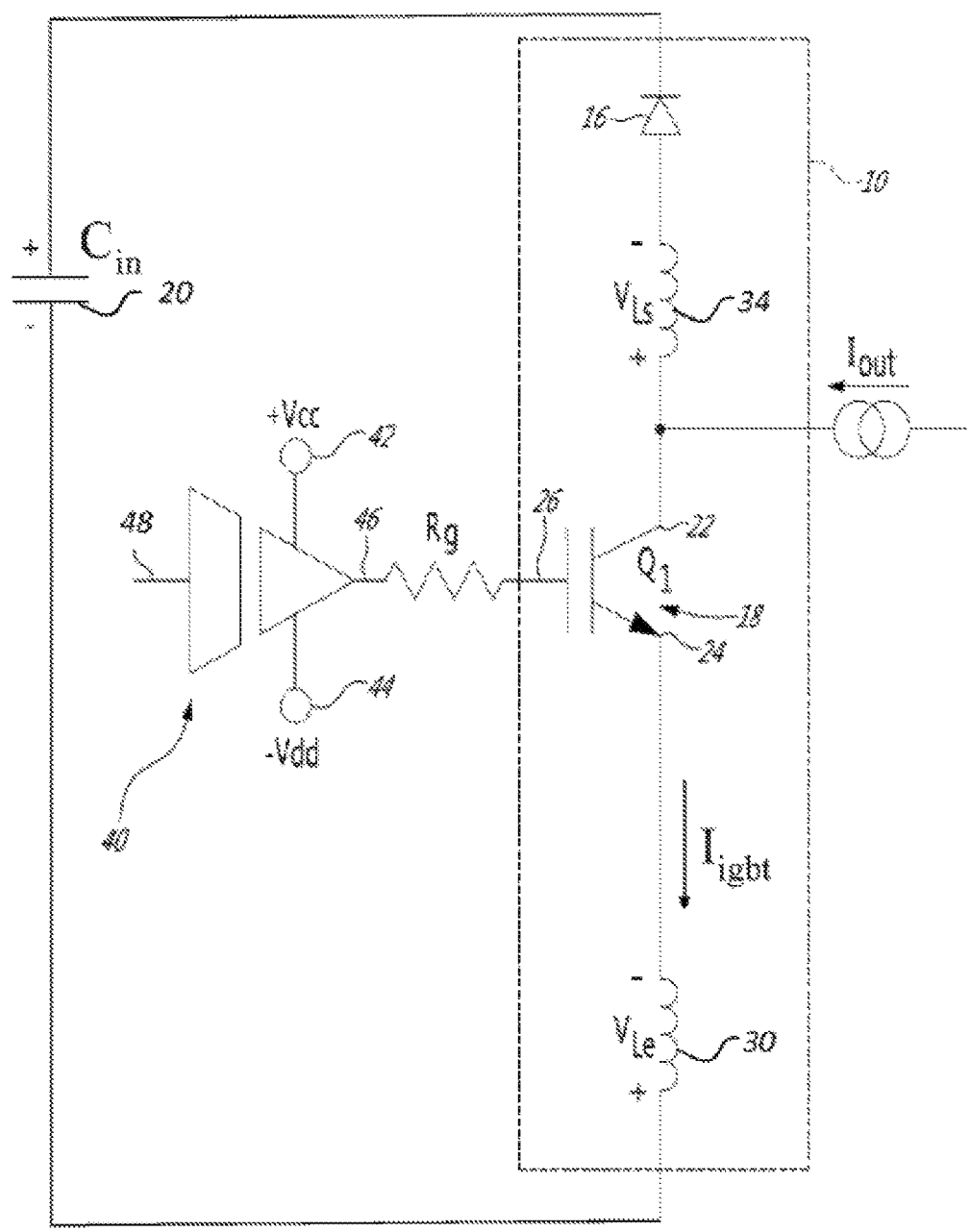
FIG. 3 is a circuit diagram of a conventional commutation cell further showing a gate driver.
Figure 4:
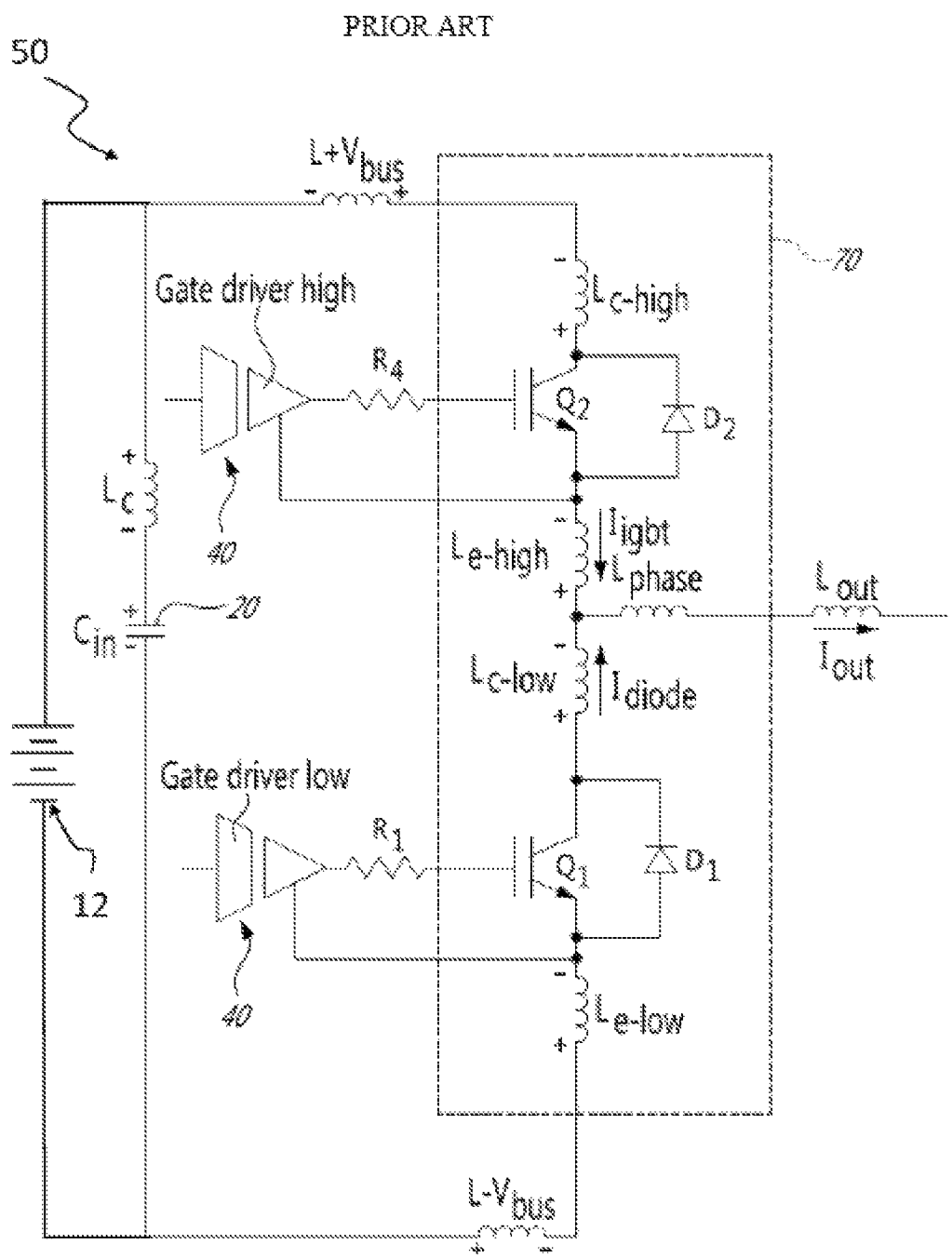
FIG. 4 is a circuit diagram of a conventional IGBT leg formed of two conventional commutation cells.

Generally stated, by changing the reference of the gate driver from the emitter (logical pin) of FIG. 4 to the ground bus (for the bottom IGBT $Q_1$) and to the collector of the bottom IGBT (for the top IGBT $Q_2$), it is possible to decrease this overvoltage of $V_{ce}$ during turn-off. In other words, a technique for connecting reference of the gate driver to a power tab of the IGBT, the power tab being itself connected to a power source, instead of to the logical pin has been developed. A voltage across the emitter inductance is injected in the gate driver to create a negative voltage at the emitter of the IGBT to slow down the negative slope of $V_{ge}$, as will be discussed hereinbelow. The result is a direct action on the gate voltage without any delay and di/dt limitations. Because a bus voltage applied by the battery 12 may vary over time or between different applications, the present disclosure introduces a variant that dynamically controls a gain applied to the voltage across the emitter inductance for injection in the gate driver of the IGBT.

Figure 5:
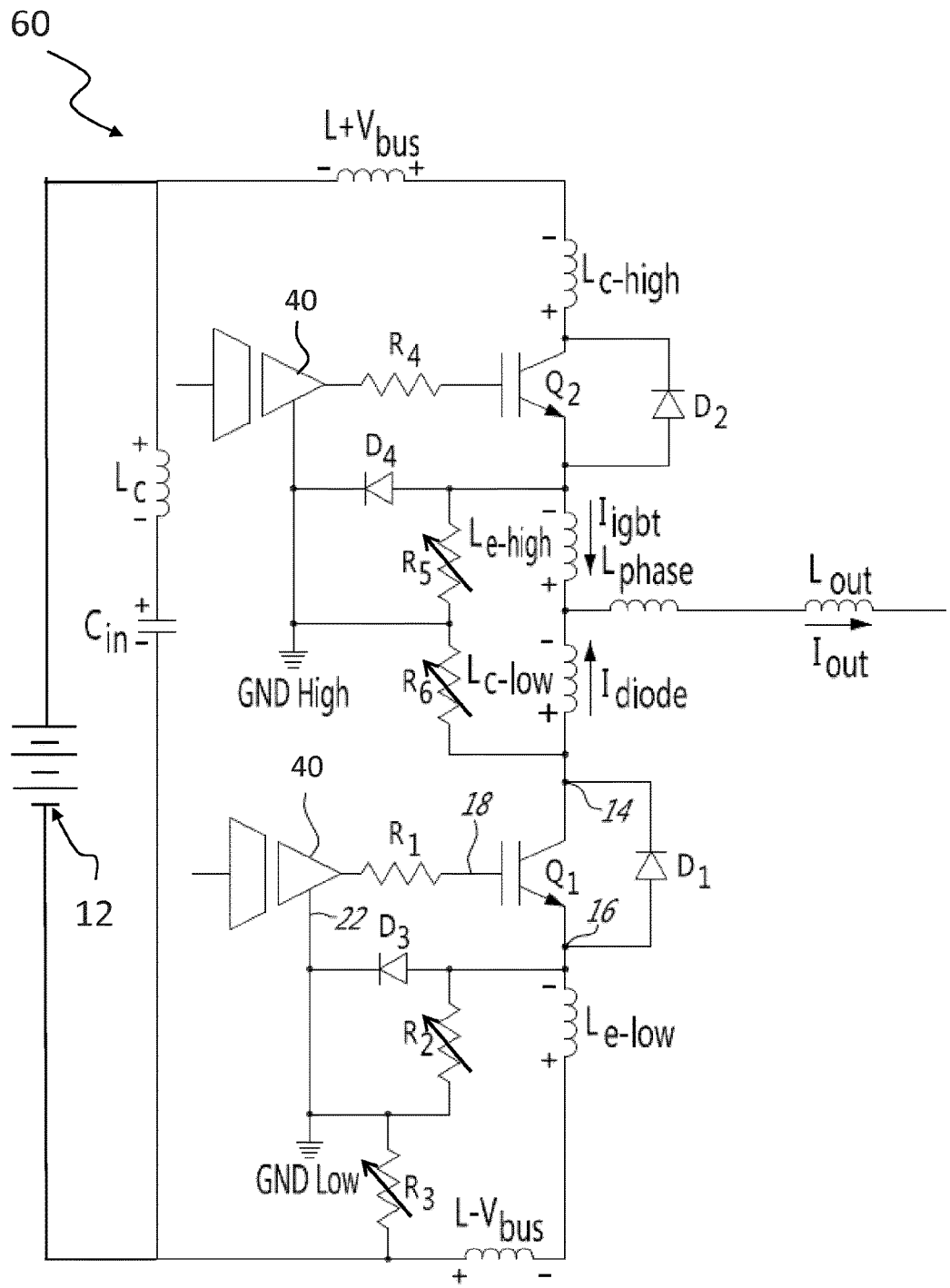
FIG. 5 is a circuit diagram of an IGBT leg having dynamically adjustable resistive dividers connected across parasitic (stray) emitter inductances, according to an embodiment.

Because there is no optimal emitter inductance between the logical and power connections of the emitter in a commercial IGBT module, the present disclosure introduces a technique developed to optimize the sample of the overvoltage injected in the gate drive circuit using a resistive divider having controllable resistors. FIG. 5 is a circuit diagram of an IGBT leg having dynamically adjustable resistive dividers connected across parasitic (stray) emitter inductances, according to an embodiment. Generally, FIG. 5 shows a power converter 60 having a pair of commutation cells connected in parallel, each commutation cell including a power electronic switch and a gate driver. The power converter 60 may for example be an IGBT leg including compensation circuits connected to gate drivers 40 in a configuration that reduces overvoltage on the IGBTs. FIG. 5 introduces a dynamically controlled compensation circuit that optimizes overvoltage on the IGBTs using dynamically controlled gain adapters constructed using controllable resistors $R_2$, $R_3$, $R_5$ and $R_6$ to form a pair of resistive dividers. FIG. 6 is a block diagram showing a controller connected to the IGBT leg of FIG. 5. On FIG. 6, a controller 82 receives from a sensor 80, for example a voltmeter, a measurement of a voltage of the battery 12 that feeds the power converter 60. The controller 82 dynamically adjusts values of the controllable resistors $R_2$, $R_3$, R5 and $R_6$ based on the actual voltage of the battery 12.

Discussing the bottom portion of the IGBT leg 90 of FIG. 5, the bottom IGBT $Q_1$ has a parasitic collector inductance $L_{c-low}$ and a parasitic emitter inductance $L_{e-low}$. The gate 18 of the bottom IGBT $Q_1$ is connected to its gate driver 40 via a resistor $R_1$. A ground reference of the gate driver 60 is connected to a compensation circuit having a resistive divider circuit including two controllable resistors $R_2$ and $R_3$ and a diode $D_3$ that allows the turn-on not to be impacted by shorting the controllable resistor $R_2$ when a voltage at the emitter of the bottom IGBT $Q_1$ is higher than the ground reference. The diode $D_3$ is conducting while turning on the IGBT $Q_1$ because the direction of the current in the IGBT $Q_1$ causes a voltage to be higher at the emitter 16 than at the ground reference. In contrast, the diode $D_3$ is not conducting while turning off the IGBT $Q_1$ because a drop of voltage at the emitter 16 causes application of a negative voltage across the diode $D_3$. It is to be noted that while the controllable resistors $R_2$ and $R_3$ are shown connected across both parasitic inductances $L_{e-low}$ and $L_{-Vbus}$, they may alternatively be connected solely across parasitic inductance $L_{e-low}$, should this parasitic inductance be sufficient and the connection available.

In the circuit of FIG. 5, values of the controllable resistors $R_2$ and $R_3$ are dynamically controlled according to an actual voltage of the battery 12, which is applied to the IGBT leg, and to an acceptable overvoltage level allowed across the bottom IGBT $Q_1$. A ratio of $R_2$ over $R_3$ can be dynamically increased as directed by the controller 82 to reduce the overvoltage, or decreased when some more overvoltage can be tolerated by the IGBT $Q_1$. While individual values of $R_2$ and of $R_3$ are modified, their sum remains constant. The value of these two controllable resistors $R_2$ and $R_3$ in parallel is set, in series with a gate driver resistor $R_1$. A value of the gate driver resistor $R_1$ is adjusted in a conventional manner according to a proper commutation behavior. By correctly adjusting values of the controllable resistors of the compensation circuits, it is possible to reduce the effect of the emitter inductance to get the maximum overvoltage allowed to therefore improve the efficiency. The total voltage on the IGBT $Q_1$ at turn-off depends on the voltage generated on parasitic inductances, including the voltage generated on the emitter parasitic inductance $L_{e-low}$, and on the voltage of the battery 12. If the voltage of the battery 12 decreases, a comparable increase of the voltage generated on the parasitic inductances may be allowed without exceeding the maximum rating of the IGBT $Q_1$; the opposite being of course true as well. The controller 82 adjusts the values of the controllable resistors $R_2$ and $R_3$ to maintain the voltage on the IGBT $Q_1$ within its maximum rating, under varying conditions. For a given desired output power level, a higher voltage of the battery 12 implies a lower current, which in turn implies lower conduction losses. The switching losses can be increased so that it becomes possible to maintain the same desired power level with different battery voltages.

In other words, the normal practice consisting in using a resistor $R_1$ in the ground connection of the gate driver to limit the current in the diodes that protect the gate driver of the lower IGBT $Q_1$ from a negative voltage when the upper IGBT $Q_2$ turns off has been modified by splitting the resistor in two resistors, including $R_1$ in series with the controllable resistors $R_2$ and $R_3$ connected in parallel, and by dynamically adapting their ratio to limit the effect of the emitter inductance on the di/dt. The voltage divider dynamically gives the desired weight of the emitter inductance to limit the overvoltage at the desired level, under varying voltages of the battery 12.

The overvoltage can be optimized as much as possible to reach the maximum IGBT rating while maintaining the speed of the di/dt for efficiency reasons. This is done by reducing a value of $R_2$, the controllable resistor connected to the IGBT $Q_1$ emitter, while increasing $R_3$, the controllable resistor connected to the power tab. The voltage across the emitter inductance is thus split in two and only the voltage across the logical resistor is applied in the gate drive circuit to limit the gate voltage drop.

Of course, in the top portion of the IGBT leg 90 of FIG. 5, the controllable resistors $R_5$ and $R_6$ are controlled in the same manner by the controller 82 to control the overvoltage on the top IGBT $Q_2$.

The foregoing describes solutions applicable to DC-DC converters, AC-DC converters and to DC-AC power converters, for example commutation cells using a full leg of semiconductors, opposite pairs of power electronic switches and freewheel diodes, to provide alternative current to a connected load such as a motor of an electric vehicle.

Those of ordinary skill in the art will realize that the description of the commutation cell, power converter and compensation circuit are illustrative only and are not intended to be in any way limiting. Other embodiments will readily suggest themselves to such persons with ordinary skill in the art having the benefit of the present disclosure. Furthermore, the commutation cell, power converter and compensation circuit may be customized to offer valuable solutions to existing needs and problems of overvoltage occurring upon switching of commutation cells.

In the interest of clarity, not all of the routine features of the implementations of the commutation cell, power converter and compensation circuit are shown and described. It will, of course, be appreciated that in the development of any such actual implementation of the commutation cell, power converter and compensation circuit, numerous implementation-specific decisions may need to be made in order to achieve the developer's specific goals, such as compliance with application-, system-, and business-related constraints, and that these specific goals will vary from one implementation to another and from one developer to another. Moreover, it will be appreciated that a development effort might be complex and time-consuming, but would nevertheless be a routine undertaking of engineering for those of ordinary skill in the field of power electronics having the benefit of the present disclosure.

It is to be understood that the commutation cell, power converter and compensation circuit are not limited in their application to the details of construction and parts illustrated in the accompanying drawings and described hereinabove. The proposed commutation cell, power converter and compensation circuit are capable of other embodiments and of being practiced in various ways. It is also to be understood that the phraseology or terminology used herein is for the purpose of description and not limitation. Hence, although the commutation cell, power converter and compensation circuit have been described hereinabove by way of illustrative embodiments thereof, they can be modified, without departing from the spirit, scope and nature of the subject invention.

What is claimed is:

1. A commutation cell configured for limiting switching overvoltage, comprising:
   a power electronic switch having a parasitic emitter inductance through which a voltage is generated upon turning off of the power electronic switch; and
   a dynamically controlled compensation circuit connected to the parasitic emitter inductance, the compensation circuit applying a controllable portion of the voltage generated through the parasitic emitter inductance at turn-off of the power electronic switch to control the voltage generated through the parasitic emitter inductance; the compensation circuit being dynamically controlled to change the controllable portion of the voltage generated through the parasitic emitter inductance based on a voltage of a power source which is configured to power the commutation cell.

2. The commutation cell of claim 1, wherein the compensation circuit comprises a dynamically controlled gain adapter defining the applied controllable voltage portion.

3. The commutation cell of claim 1, wherein the compensation circuit includes first and second controllable resistors.

4. The commutation cell of claim 3, wherein the compensation circuit further includes a turn-on diode placed in parallel with the first controllable resistor, the turn-on diode becoming conductive upon turn-on of the power electronic switch.

5. The commutation cell of claim 3, wherein a sum of resistances of the first and second controllable resistors is constant.

6. The commutation cell of claim 1, wherein the power electronic switch is selected from an isolated gate bipolar transistor, a metal-oxide-semiconductor field-effect transistor and a bipolar transistor.

7. The commutation cell of claim 1, further comprising:
   a freewheel diode operating in tandem with the power electronic switch.

8. The commutation cell of claim 7, further comprising:
   a gate driver connected to the compensation circuit and to a gate of the power electronic switch, the gate driver controlling a gate to emitter voltage applied to the power electronic switch.

9. The commutation cell of claim 8, wherein the gate driver includes a reference and wherein the controllable portion of the voltage generated through the parasitic emitter inductance is added between the reference of the gate driver and the gate of the power electronic switch.

10. The commutation cell of claim 1, further comprising:
    a sensor of the voltage of the power source which is configured to power the commutation cell; and
    a controller operably connected to the sensor and adjusting the controllable portion of the voltage generated through the parasitic emitter inductance at turn-off of the power electronic switch.

11. A power converter, comprising:
    a leg having two commutation cells, each of the two commutation cells including a power electronic switch having a parasitic emitter inductance through which a voltage is generated upon turning off of the power electronic switch and a dynamically controlled compensation circuit connected to the parasitic emitter inductance, each of the compensation circuits applying a respective controllable portion of the voltage generated through the respective parasitic emitter inductance at turn-off of the respective power electronic switch to control the voltage generated through the respective parasitic emitter inductance; each of the compensation circuits being dynamically controlled to change the respective controllable portion of the voltage generated through the respective parasitic emitter inductance based on a voltage of a power source which is configured to power each of the two commutation cells,
    wherein the two commutation cells form a loop and are connected at a junction of a collector of a first power electronic switch of a first commutation cell and of an emitter of a second power electronic switch of a second commutation cell.

12. The power converter of claim 11, further comprising:
    a sensor of the voltage of the power source which is configured to power each of the two commutation cells; and
    a controller operably connected to the sensor and adjusting each of the applied controllable voltage portions in the two commutation cells.

13. A compensation circuit for limiting switching overvoltage on a power electronic switch of a commutation cell, the commutation cell including a high frequency loop having a parasitic inductance through which a voltage is generated upon turning off of the power electronic switch, the high frequency loop parasitic inductance including a parasitic emitter inductance of the power electronic switch, the compensation circuit comprising:
    a dynamically controlled voltage divider configured to provide a controllable gain of a voltage generated through the parasitic emitter inductance at turn-off of the power electronic switch; and
    a connection from the voltage divider to apply, to a gate driver of the power electronic switch, a controllable portion of the voltage generated through the parasitic emitter inductance according to the controllable gain to reduce the voltage generated through the parasitic inductance of the high frequency loop,
    wherein the voltage divider is dynamically controlled to change the controllable portion of the voltage generated through the parasitic emitter inductance based on a voltage of a power source which is configured to power the commutation cell.

14. The compensation circuit of claim 13, wherein the dynamically controlled voltage divider includes first and second controllable resistors.

15. The compensation circuit of claim 14, further comprising:
    a turn-on diode placed in parallel with the first controllable resistor, the turn-on diode becoming conductive upon turn-on of the power electronic switch.

16. The compensation circuit of claim 14, wherein a sum of resistances of the first and second controllable resistors is constant.

17. The compensation circuit of claim 13, further comprising:
    a sensor of the voltage of the power source which is configured to power the commutation cell; and
    a controller operably connected to the sensor and adjusting the controllable gain of the voltage generated through the parasitic emitter inductance based on the controllable voltage portion applied to the commutation cell.

\* \* \* \* \*